(12) United States Patent
Ulbrich

(10) Patent No.: US 6,342,809 B1
(45) Date of Patent: Jan. 29, 2002

(54) CLOSED LOOP CIRCUIT SWITCH MODE POWER AMPLIFIER

(75) Inventor: Stephen F. Ulbrich, Anaheim Hills, CA (US)

(73) Assignee: Integrated Power Technologies, Ltd., Anaheim Hills, CA (US)

( * ) Notice: Subject to any disclaimer, the term of this patent is extended or adjusted under 35 U.S.C. 154(b) by 0 days.

(21) Appl. No.: 09/428,142

(22) Filed: Oct. 26, 1999

(51) Int. Cl.[7] .......................... H03F 3/38; H03F 3/217
(52) U.S. Cl. .................................. 330/10; 330/207 A
(58) Field of Search ............................ 330/10, 207.4, 330/251

(56) References Cited

U.S. PATENT DOCUMENTS 5,610,553 A * 3/1997 Kirn ............................ 330/10
6,016,075 A * 1/2000 Hamo ......................... 330/10
6,118,336 A * 9/2000 Pullen et al. ................. 330/10

* cited by examiner

*Primary Examiner*—Steven J. Mottola
(74) *Attorney, Agent, or Firm*—Gene Scott-Patent Law & Venture Group

(57) ABSTRACT

A switch mode power amplifier circuit apparatus comprises a fixed gain amplifier, modulator and a filter circuit electrically configured so as to direct a feedback signal for reducing clock ripple and improving signal fidelity at an output takeoff point in the amplifier circuit. An amplifier output is directed to the modulator and a modulator output is directed into an inductor of the filter circuit. The feedback signal is directed from the filter circuit to an amplifier input.

5 Claims, 1 Drawing Sheet

CLOSED LOOP CIRCUIT SWITCH MODE POWER AMPLIFIER

BACKGROUND OF THE INVENTION

1. Field of the Invention

This invention relates generally to switch mode power amplifiers, and more particularly to such an amplifier having a closed loop circuit providing improved signal fidelity and low clock ripple.

2. Description of Related Art

Feedback theory and prior art teaches that maximized loop gain at frequency results in the highest signal fidelity, i.e., least distortion, noise, etc. Thus, prior art uses high gain amplifiers, e.g., 60 db or more, in an integrator configuration to realize this advantage. This forces the feedback point to be taken prior to the output LC filter in the typical switch mode power amplifier because of the great difficulty in providing adequate frequency compensation. The prior art teaches us that good signal fidelity has not been achieved as expected.

The approach taken in the prior art (See FIG. 1) causes a dynamic range problem for the output power stage because of the RC filter used in the feedback loop to reduce the clock feed-through to the integrator. For the same magnitude of feedback error signal, the driving point voltage into the RC network must increase with frequency, thus limiting the dynamic range. In the present invention the driving point feedback signal amplitude is independent of frequency up to the open loop bandwidth, thus preserving the dynamic range.

The prior art teaches reduction of distortion in a power amplifier through the use of a high gain integrator as a signal input device. However, the prior art does not teach that greater improvements may be made by using a low, fixed gain amplifier in the input stage with feedback taken directly from the output point. The present invention fulfills these needs and provides further related advantages as described in the following summary.

SUMMARY OF THE INVENTION

The present invention teaches certain benefits in construction and use which give rise to the objectives described below.

The present invention provides a switching mode power amplifier circuit apparatus comprising a fixed gain amplifier, modulator and a filter circuit electrically configured so as to direct a feedback signal for reducing clock ripple at an output takeoff point in the amplifier circuit. An amplifier output is directed to the modulator and a modulator output is directed into an inductor of the filter circuit. The feedback signal is directed from the filter circuit to an amplifier input.

This invention demonstrates that superior performance can be achieved when a relatively low gain amplifier (10 to 20 db) and output LC filter is used. As a matter of fact, high open loop bandwidths (up to 60 kHz) can be applied. This is important in that the low frequency gain up to the bandwidth is constant and thus fidelity is not a function of frequency, whereas in the prior art approach, the integrator time constant approaches a few Hertz and fidelity is a strong function of frequency. Since feedback is taken from the output LC filter, and consequently directly across the load, errors created here will be reduced by the feedback signal ratio.

A primary objective of the present invention is to provide an electrical circuit having advantages not taught by the prior art.

Another objective is to provide a feedback loop capable of reducing distortion in the circuit's output.

A further objective is to provide such a circuit that may be produced with low cost.

Other features and advantages of the present invention will become apparent from the following more detailed description, taken in conjunction with the accompanying drawings, which illustrate, by way of example, the principles of the invention.

BRIEF DESCRIPTION OF THE DRAWING

The accompanying drawings illustrate the present invention. In such drawings.

DETAILED DESCRIPTION OF THE INVENTION

Figure 1:
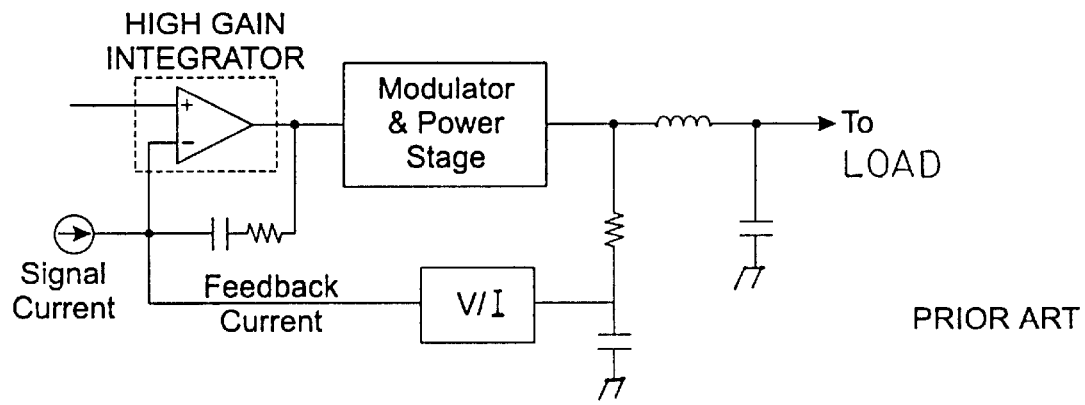
FIG. 1 is an electrical schematic diagram of a prior art circuit.
Figure 2:
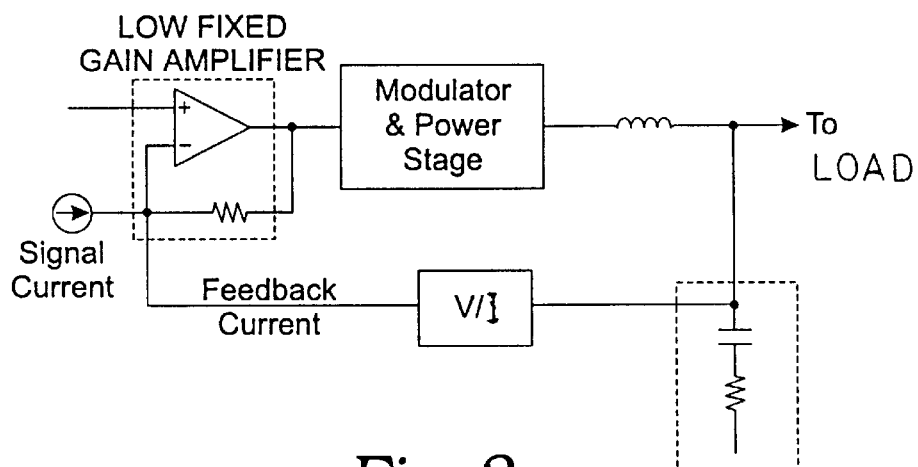
FIG. 2 is an electrical schematic diagram of the preferred embodiment of the present invention.

As shown in the prior art circuit of FIG. 1, the conventional manner for producing such circuits uses a high gain integrator capable of a 50–60 db signal boost or a gain of 1000 or more. The prior art wisdom fosters the belief that in order to get good feedback high gain must be used, i.e., error may be divided by gain. Here the feedback signal is isolated from the output point by the inductor in the filter stage. FIG. 2 illustrates the present invention, a switch mode power amplifier circuit apparatus comprising a fixed gain amplifier, a modulator and an LC filter circuit electrically configured so as to direct a feedback signal, from the filter circuit at the output point, to the power amplifier for reducing clock ripple. An amplifier output is directed to the modulator and a modulator output is directed into an inductor of the filter circuit. The feedback signal is directed from the takeoff point back into the amplifier input. The invention is designed to drive an output device such as a loudspeaker. Clock ripple may be reduced by 40 db or more.

While the invention has been described with reference to at least one preferred embodiment, it is to be clearly understood by those skilled in the art that the invention is not limited thereto. Rather, the scope of the invention is to be interpreted only in conjunction with the appended claims.

What is claimed is:

1. A switch mode low gain power amplifier circuit apparatus comprising: a fixed gain amplifier, modulator and a filter circuit electrically configured so as to direct a feedback signal taken from an output of the filter circuit to an input of the fixed gain amplifier for reducing clock ripple and improving signal fidelity at an output takeoff point in the amplifier circuit; an amplifier output directed to the modulator and the modulator output is directed into an inductor of the filter circuit, the inductor being directly connected to the output takeoff point; and the feedback signal is directed from the output takeoff point to an input of the fixed gain amplifier.

2. The apparatus of claim 1 wherein the modulator comprises a power amplification stage.

3. The apparatus of claim 1 wherein the filter circuit is directed into an output device at the output takeoff point.

4. The apparatus of claim 3 wherein the output device is a loudspeaker.

5. The apparatus of claim 1 wherein the filter circuit is of the LC type.

* * * * *